United States Patent
Mizutani et al.

(10) Patent No.: US 10,062,580 B2
(45) Date of Patent: Aug. 28, 2018

(54) ETCHANT, ETCHING METHOD USING SAME, AND METHOD FOR MANUFACTURING SEMICONDUCTOR SUBSTRATE PRODUCT

(71) Applicant: FUJIFILM Corporation, Tokyo (JP)

(72) Inventors: Atsushi Mizutani, Shizuoka (JP); Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/245,593

(22) Filed: Aug. 24, 2016

(65) Prior Publication Data

US 2016/0365254 A1 Dec. 15, 2016

Related U.S. Application Data

(63) Continuation of application No. PCT/JP2015/054679, filed on Feb. 19, 2015.

(30) Foreign Application Priority Data

Feb. 26, 2014 (JP) ................................ 2014-035630

(51) Int. Cl.
| | | |
|---|---|---|
| *H01L 21/302* | (2006.01) | |
| *H01L 21/461* | (2006.01) | |
| *C03C 15/00* | (2006.01) | |
| *C03C 25/68* | (2006.01) | |
| *H01L 21/3213* | (2006.01) | |
| *C23F 1/10* | (2006.01) | |
| *C23F 1/14* | (2006.01) | |
| *H01L 21/02* | (2006.01) | |
| *C23F 1/00* | (2006.01) | |
| *C23F 1/26* | (2006.01) | |

(Continued)

(52) U.S. Cl.
CPC .......... *H01L 21/32134* (2013.01); *C23F 1/00* (2013.01); *C23F 1/10* (2013.01); *C23F 1/14* (2013.01); *C23F 1/26* (2013.01); *C23F 1/30* (2013.01); *H01L 21/02019* (2013.01); *H01L 21/02381* (2013.01); *H01L 29/665* (2013.01); *H01L 29/78* (2013.01)

(58) Field of Classification Search
None
See application file for complete search history.

(56) References Cited

U.S. PATENT DOCUMENTS

| | | |
|---|---|---|
| 2007/0009449 A1 | 1/2007 | Kanca, III |
| 2008/0073614 A1 | 3/2008 | Akiyama et al. |

(Continued)

FOREIGN PATENT DOCUMENTS

| | | |
|---|---|---|
| CN | 101153395 A | 4/2008 |
| JP | 2015/054679 A1 | 4/2015 |

(Continued)

OTHER PUBLICATIONS

International Search Report of PCT/JP2015/054679 dated Apr. 28, 2015 [PCT/ISA/210].

(Continued)

*Primary Examiner* — Stephanie P. Duclair
(74) *Attorney, Agent, or Firm* — Sughrue Mion, PLLC

(57) ABSTRACT

Provided is an etchant for a semiconductor process, which contains a sulfonic acid compound, a halogen ion, nitric acid or a nitric acid ion, an organic cation, and water.

6 Claims, 3 Drawing Sheets

(51) Int. Cl.
     *C23F 1/30*      (2006.01)
     *H01L 29/66*      (2006.01)
     *H01L 29/78*      (2006.01)

(56)             References Cited

U.S. PATENT DOCUMENTS

2012/0231632 A1*   9/2012   Takahashi .............. C09K 13/06
                                                                         438/754
2013/0130500 A1    5/2013   Sato et al.

FOREIGN PATENT DOCUMENTS

KR    10-2014-0022006 A    2/2014
WO       2012/125401 A1    9/2012

OTHER PUBLICATIONS

Communication dated Oct. 20, 2017, from Korean Intellectual Property Office in counterpart application No. 10-2016-7023826.
Communication dated Apr. 3, 2018, issued by the Korean Intellectual Property Office in corresponding Korean Application No. 10-2016-7023826.
Communication dated Mar. 26, 2018, from the State Intellectual Property Office of People's Republic of China in counterpart Application No. 201580010484.0.

* cited by examiner

ETCHANT

ETCHANT, ETCHING METHOD USING SAME, AND METHOD FOR MANUFACTURING SEMICONDUCTOR SUBSTRATE PRODUCT

CROSS-REFERENCE TO RELATED APPLICATIONS

This application is a Continuation of PCT International Application No. PCT/JP2015/054679 filed on Feb. 19, 2015, which claims priority under 35 U.S.C. § 119 (a) to Japanese Patent Application No. JP2014-035630 filed in Japan on Feb. 26, 2014. Each of the above applications is hereby expressly incorporated by reference, in its entirety, into the present application.

BACKGROUND OF THE INVENTION

1. Field of the Invention

The present invention relates to an etchant, an etching method using the same, and a method for manufacturing a semiconductor substrate product.

2. Description of the Related Art

An integrated circuit is manufactured in multiple stages of various processing processes. Specifically, in the manufacturing process, deposition of various materials, lithography of a layer of which an entire portion or a necessary portion is exposed, or etching of the layer is repeated several times. Among these, the etching of a layer of a metal or a metal compound becomes to be an important process. A metal or the like is selectively etched and other layers are required to remain without corroding. In some cases, it is necessary that only a predetermined layer be removed in the form in which layers formed of similar metals and a layer with high corrodability remain. Wiring in a semiconductor substrate or the size of integrated circuits are becoming smaller and thus the importance of performing accurately etching on a member such that it remains without corroding has been increasing.

When an example of field effect transistors is considered, there has been a strong demand for thinning of a silicide layer to be formed on the upper surface of a source and drain region and development of new materials along with rapid miniaturization of field effect transistors. In a salicide process of forming the silicide layer, a part of a source region and a drain region formed of silicon and the like formed on a semiconductor substrate and a metal layer attached to the upper surface thereof are annealed. For a metal layer, tungsten (W), titanium (Ti), cobalt (Co), or nickel (Ni) is being used. In this manner, a silicide layer with low resistance can be formed on the upper side of a source and drain electrode or the like. Currently, in response to further miniaturization, formation of a NiPt silicide layer to which platinum (Pt) which is a noble metal is added has been suggested.

After the salicide process is performed, the metal layer remaining in the region is removed by etching. The etching is usually performed through wet etching and a mixed solution (aqua regia) of hydrochloric acid and nitric acid is used as a liquid chemical. WO2012/125401A discloses an example of using a liquid chemical to which toluenesulfonic acid is added in addition to nitric acid and hydrochloric acid.

SUMMARY OF THE INVENTION

An object of the present invention is to provide an etchant which is capable of selectively removing a layer containing a specific metal with respect to a layer containing germanium and exhibits excellent etching characteristics, an etching method using the same, and method for manufacturing a semiconductor substrate product.

According to the present invention, the following means are provided.

[1] An etchant for a semiconductor process, comprising: a sulfonic acid compound; a halogen ion (halide ion); nitric acid or a nitric acid ion; an organic cation; and water.

[2] The etchant according to [1], in which the organic cation is at least one selected from the group consisting of an alkyl ammonium cation, an aryl ammonium cation, and an alkyl-aryl ammonium cation.

[3] The etchant according to [1] or [2], in which the sulfonic acid compound is at least one selected from the group consisting of methanesulfonic acid, toluenesulfonic acid, ethanesulfonic acid, benzenesulfonic acid, methanedisulfonic acid, and octyl sulfonic acid.

[4] The etchant according to any one of [1] to [3], in which the halogen ion is at least one selected from the group consisting of a chlorine ion, a bromine ion, an iodine ion, and a fluorine ion.

[5] The etchant according to any one of [1] to [4], in which the concentration of the sulfonic acid compound is in a range of 40% by mass to 80% by mass.

[6] The etchant according to any one of [1] to [5], in which the concentration of the halogen ion is in a range of 0.01% by mass to 10% by mass.

[7] The etchant according to any one of [1] to [6], in which the concentration of the nitric acid or the nitric acid ion is in a range of 1% by mass to 20% by mass.

[8] The etchant according to any one of [1] to [7], in which the concentration of the organic cation is in a range of 0.000001 mol/L to 0.1 mol/L.

[9] The etchant according to any one of [1] to [8], in which the concentration of the water is in a range of 10% by mass to 50% by mass.

[10] The etchant according to any one of [1] to [9] which is applied to a semiconductor substrate having a first layer that includes germanium and a second layer that includes a metal species other than germanium.

[11] The etchant according to [10], in which the second layer is a layer including at least one metal species selected from nickel platinum, titanium, nickel, platinum, tungsten, and cobalt.

[12] An etching method comprising: applying an etchant which contains a sulfonic acid compound, a halogen ion, nitric acid or a nitric acid ion, an organic cation, and water to a semiconductor substrate.

[13] The etching method according to [12], in which the organic cation is at least one selected from the group consisting of an alkyl ammonium cation, an aryl ammonium cation, and an alkyl-aryl ammonium cation.

[14] The etching method according to [12] or [13], in which the concentration of the organic cation is in a range of 0.000001 mol/L to 0.1 mol/L.

[15] The etching method according to any one of [12] to [14], in which a semiconductor substrate has a first layer that includes germanium and a second layer that includes a metal species other than germanium.

[16] The etching method according to any one of [12] to [15], in which the second layer is a layer including at least one metal species selected from nickel platinum, titanium, nickel, platinum, tungsten, and cobalt.

[17] The etching method according to [15] or [16], in which a ratio (R2/R1) of an etching rate R2 of the second layer to an etching rate R1 of the first layer is 10 or greater.

[18] A method for manufacturing a semiconductor substrate product, in which a semiconductor substrate product is manufactured through the etching method according to any one of [12] to [17].

According to the etchant, the etching method using the same, and the method for manufacturing a semiconductor substrate product of the present invention, it is possible to selectively remove a layer containing a specific metal with respect to a layer containing germanium.

The above-described and other features and advantages of the present invention will become apparent from the description below with reference to the accompanying drawings.

DESCRIPTION OF THE PREFERRED EMBODIMENTS

First, preferred embodiments of an etching process according to an etching method of the present invention will be described with reference to FIGS. 1a to 2E.

[Etching Process]

Figure 1A:
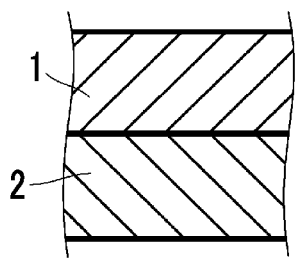
FIGS. 1a to 1c show sections schematically illustrating examples of a process of preparing a semiconductor substrate according to an embodiment of the present invention.
Figure 1B:
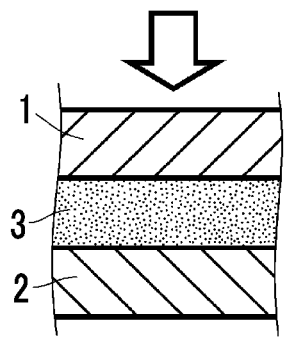
Figure 1C:
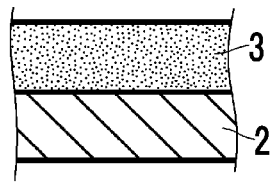

FIGS. 1a to 1c illustrate a semiconductor substrate before and after etching is performed. In manufacturing examples of the present embodiment, a metal layer (second layer) 1 is arranged on the upper surface of a germanium-containing layer (first layer) 2. As the germanium-containing layer (first layer), a SiGe epitaxial layer constituting a source electrode or a drain electrode is used. In the present invention, it is preferable that the germanium-containing layer is a SiGe epitaxial layer or a Ge epitaxial layer in terms that remarkable effects of the etchant are exhibited.

Examples of a constituent material of the metal layer (second layer) 1 include a metal species (a single metal or a composite metal) such as titanium (Ti), cobalt (Co), nickel (Ni), nickel platinum (NiPt), or tungsten (W). In order to form a metal layer, a method typically used to form such a metal film can be used. Specifically, a film formation method using chemical vapor deposition (CVD) is exemplified. In this case, the thickness of the metal layer is not particularly limited, but a film having a thickness of 5 nm to 50 nm is exemplified. In the present invention, it is preferable that a metal layer is a NiPt layer (the content of Pt is preferably greater than 0% by mass to 20% by mass) or a Ni layer (the content of Pt is 0% by mass) in terms that remarkable effects of the etchant are exhibited.

The metal layer may contain other elements other than the metal atoms exemplified above. For example, oxygen or nitrogen to be inevitably mixed thereinto may be present. It is preferable that the amount of inevitable impurities is suppressed within a range of 1 ppt to 10 ppm (on a mass basis).

After the metal layer 1 is formed on the upper side of the germanium-containing layer 2 in the above-described process (a), annealing (sintering) is performed and a metal-Si reaction film (third layer: germanium silicide layer) 3 is formed on the interface thereof (process (b)). The annealing may be performed under conditions typically used for manufacturing this kind of element, and a treatment performed in a temperature range of 200° C. to 1000° C. is exemplified. In this case, the thickness of the germanium silicide layer 3 is not particularly limited, but a layer having a thickness of 50 nm or less or a layer having a thickness of 10 nm or less is exemplified. The lower limit is not particularly limited, but is practically 1 nm or greater. The germanium silicide layer is used as a low resistance film and functions as a conductive portion that electrically connects a source electrode, and a drain electrode positioned in the lower portion thereof, and a wiring arranged in the upper portion thereof. Accordingly, the conduction is inhibited when defects or corrosion occurs in the germanium silicide layer and this leads to degradation in quality such as malfunction of an element in some cases. Particularly, recently, the structure of an integrated circuit in the inside of a substrate has been miniaturized and thus even a small amount of damage may have a great impact on the performance of the element. Consequently, it is desired to prevent such defects or corrosion as much as possible.

Moreover, in the present specification, the germanium silicide layer is included in the germanium-containing layer of the first layer in a broad sense. Therefore, selective removal of the second layer with respect to the first layer includes an aspect of preferentially removing the second layer (metal layer) with respect to the germanium-containing layer which is not silicided and an aspect of preferentially removing the second layer (metal layer) with respect to the germanium silicide layer. In a narrow sense, when it is necessary to distinguish the germanium-containing layer (excluding the germanium silicide layer) of the first layer from the germanium silicide layer of the third layer, the layers are respectively referred to as the first layer and the third layer.

Next, the remaining metal layer 1 is etched (process (b)→process (c)). In the present embodiment, the etchant is used at this time and the metal layer 1 is removed by providing the etchant from the upper side of the metal layer 1 to be in contact with the metal layer 1. The provision of the etchant will be described below.

The germanium-containing layer 2 is formed of a SiGe epitaxial layer and can be formed through crystal-growth on a silicon substrate having a specific crystallinity according to a chemical vapor deposition (CVD) method. Alternatively, an epitaxial layer with a desired crystallinity may be formed according to electron beam epitaxy (MBE) method.

In order to use the germanium-containing layer as a P type layer, it is preferable that boron (B) having a concentration of $1 \times 10^{14}$ $cm^{-3}$ to $1 \times 10^{21}$ $cm^{-3}$ is doped. In order to use the germanium-containing layer as an N type layer, it is preferable that phosphorus (P) having a concentration of $1 \times 10^{14}$ $cm^{-3}$ to $1 \times 10^{21}$ $cm^{-3}$ is doped.

The Ge concentration in the SiGe epitaxial layer is preferably 20% by mass or greater and more preferably 40% by mass or greater. The upper limit thereof is preferably 100% by mass or less and more preferably 90% by mass or less. Since the in-plane uniformity of a treated wafer can be improved, it is preferable that the Ge concentration is set to be within the above-described range. The reason why it is preferable that Ge has a relatively high concentration is assumed as follows. In a case where Ge is compared with Si, it is understood that an oxide film SiOx is generated after Si is oxidized and the oxidizing species become a reaction-stop layer without being eluted. For this reason, a difference is generated between a portion in which Ge is eluted and a portion in which the reaction is stopped due to SiOx within the wafer and thus the in-plane uniformity of the wafer is damaged. Meanwhile, it is considered that the influence of inhibition of SiOx according to the above-described mechanism becomes decreased when the Ge concentration becomes greater and thus the in-plane uniformity of the wafer can be secured when a liquid chemical with high removability with respect to the metal layer such as the etchant of the present invention is used. In addition, in a case where the concentration of germanium is 100% by mass, a layer formed along with an alloy of the second layer resulting from the annealing contains germanium and specific metal elements of the second layer and does not contain silicon, but is referred to as a germanium silicide layer including the above-described meaning for the sake of convenience in the present specification.

(Ge Concentration)

In the present invention, the concentration of germanium is set as a value measured by the following measurement method. In a substrate of a layer containing germanium (Ge), a depth direction of 0 nm to 30 nm was analyzed using etching ESCA (Quantera, manufactured by ULVAC-PHI, INC.) and the average value of the Ge concentration in the analysis results at 3 nm to 15 nm is set as the Ge concentration (% by mass).

After the salicide process, the germanium silicide layer is formed as a layer containing germanium (Ge) and components (the above-described specific metal species) of the second layer between the germanium-containing layer (first layer) and the metal layer (second layer). The germanium silicide layer is included in the first layer in a broad sense, but is referred to as a "third layer" when distinguished from the first layer in a narrow sense. The composition thereof is not particularly limited, but "x+y" is preferably in a range of 0.2 to 0.8 and more preferably in a range of 0.3 to 0.7 in the formula of SixGeyMz (M: metal element) when "x+y+z" is set to 1. In a case of z, z is preferably in a range of 0.2 to 0.8 and more preferably in a range of 0.3 to 0.7. The preferable range of the ratio of x to y is as defined above. In this case, the third layer may contain other elements. This point is the same as that described in the section of the metal layer (second layer).

(Processing of MOS Transistor)

Figure 2A:
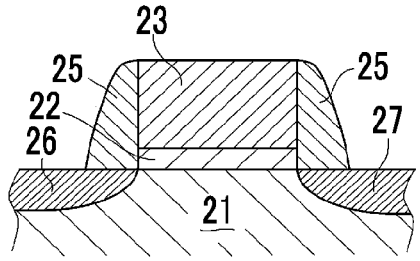
FIGS. 2A to 2E are process views illustrating examples of manufacturing a MOS transistor according to an embodiment of the present invention.
Figure 2B:
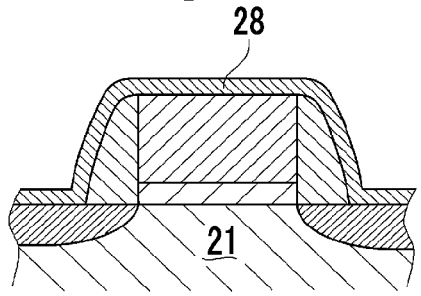
Figure 2C:
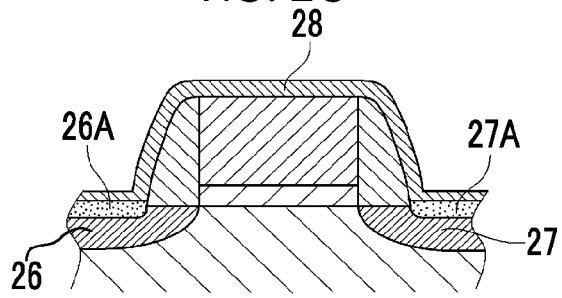
Figure 2D:
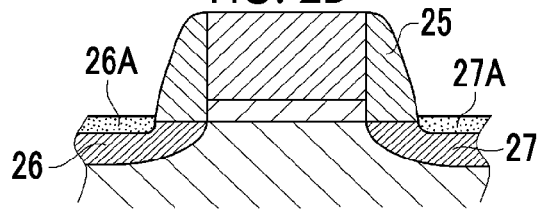
Figure 2E:
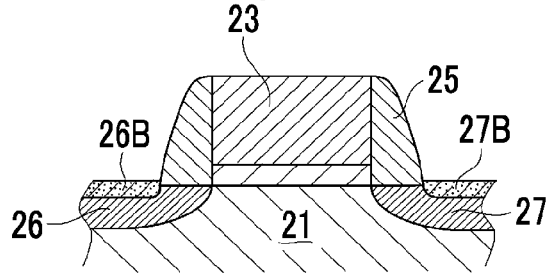

FIGS. 2A to 2E are process views illustrating examples of manufacturing a MOS transistor. FIG. 2A illustrates a process of forming the structure of the MOS transistor, FIG. 2B illustrates a process of sputtering the metal layer, FIG. 2C illustrates a first annealing process, FIG. 2D illustrates a process of selectively removing the metal layer, and FIG. 2E illustrates a second annealing process.

As illustrated in the figures, a gate electrode 23 is formed through a gate insulating film 22 formed on the surface of a silicon substrate 21. Extension regions may be individually formed on both sides of the gate electrode 23 of the silicon substrate 21. A protective layer (not illustrated) that prevents contact with a NiPt layer may be formed on the upper side of the gate electrode 23. Moreover, a side wall 25 formed of a silicon oxide film or a silicon nitride film is formed and a source electrode 26 and a drain electrode 27 are formed by ion implantation.

Next, as illustrated in the figures, a NiPt film 28 is formed and a rapid annealing treatment is performed. In this manner, elements in the NiPt film 28 are allowed to be diffused into the silicon substrate for silicidation (in the present specification, for the sake of convenience, an alloy resulting from annealing is referred to as silicidation including the case where the concentration of germanium is 100% by mass). As a result, the upper portion of the source electrode 26 and the drain electrode 27 is silicided and a NiPtGeSi source electrode portion 26A and a NiPtSiGe drain electrode portion 27A are formed. At this time, as illustrated in FIG. 2E, an electrode member can be changed to be in a desired state (an annealed silicide source electrode 26B and an annealed silicide drain electrode 27B) by performing the second annealing if necessary. The temperature of the first annealing or the second annealing is not particularly limited, but the annealing can be performed in a temperature range of, for example, 400° C. to 1100° C.

The NiPt film 28 remaining without contributing to silicidation can be removed using the etchant of the present invention (FIGS. 2C and 2D). At this time, illustration is made in a greatly schematic manner and the NiPt film remaining by being deposited on the upper portion of the silicided layer (26A and 27A) may or may not be present. The semiconductor substrate or the structure of the product thereof is illustrated in a simplified manner and, if necessary, the illustration may be interpreted such that there is a required member.

Preferred examples of the constituent materials are as follows.

Silicon substrate 21: Si, SiGe, and Ge
Gate insulating film 22: HfO$_2$ (High-k)
Gate electrode 23: Al and W
Side wall 25: SiOCN, SiN, SiO$_2$ (low-k)
Source electrode 26: SiGe and Ge
Drain electrode 27: SiGe and Ge
Metal layer 28: Ni and Pt
Cap (not illustrated): TiN
[Etchant]

Next, the etchant according to a preferred embodiment of the present invention will be described. The etchant of the present embodiment contains a sulfonic acid compound; a halogen ion; nitric acid or a nitric acid ion; an organic cation; and water. Hereinafter, respective components including optional components will be described.

(Sulfonic Acid Compound)

The etchant of the present invention contains a sulfonic acid compound. The sulfonic acid compound may be an alkylsulfonic acid compound (the number of carbon atoms is preferably in a range of 1 to 12, more preferably in a range of 1 to 6, and particularly preferably in a range of 1 to 3) or an arylsulfonic acid compound (the number of carbon atoms is preferably in a range of 6 to 14 and more preferably in a range of 6 to 10). The alkylsulfonic acid compound may be a sulfonic acid compound (the number of carbon atoms is preferably in a range of 7 to 15 and more preferably in a range of 7 to 11) having an aralkyl group.

As the alkylsulfonic acid compound, methanesulfonic acid, ethanesulfonic acid, octylsulfonic acid, methanedisulfonic acid, ethanedisulfonic acid, or benzylsulfonic acid is preferable.

As the arylsulfonic acid compound, any one of compounds represented by the following Formulae (S-1) to (S-3) is preferable. In the formulae, $Z^1$ and $Z^2$ represent a sulfonic acid group with a linking group L interposed therebetween. $R^{56}$ represents a substituent and, among the examples described above, an alkyl group (the number of carbon atoms is preferably in a range of 1 to 12, more preferably in a range of 1 to 6, and particularly preferably in a range of 1 to 3) is preferable, $n^{51}$ and $n^{56}$ represent an integer of 0 to 5.

$n^{53}$ represents an integer of 0 to 4. The maximum values of $n^{51}$, $n^{53}$, and $n^{56}$ are decreased according to the number of $Z^1$ or $Z^2$ in the same ring. $n^{52}$ represents an integer of 1 to 6 and is preferably 1 or 2. $n^{54}$ and $n^{55}$ each independently represent an integer of 0 to 4 and $n^{54}+n^{55}$ is 1 or greater. $n^{54}+n^{55}$ is preferably 1 or 2. $n^{57}$ and $n^{58}$ each independently represent an integer of 0 to 5 and $n^{57}+n^{58}$ is 1 or greater. $n^{57}+n^{58}$ is preferably 1 or 2. A plurality of $R^{56}$'s may be the same as or different from each other. A linking group L is preferably O, S, $NR^N$, an alkylene group (the number of carbon atoms is preferably in a range of 1 to 12, more preferably in a range of 1 to 6, and particularly preferably in a range of 1 to 3), or a combination of these. It is preferable that $R^N$ represents an alkyl group (the number of carbon atoms is preferably in a range of 1 to 12, more preferably in a range of 1 to 6, and particularly preferably in a range of 1 to 3), an aryl group (the number of carbon atoms is preferably in a range of 6 to 22 and more preferably in a range of 6 to 14), or a hydrogen atom.

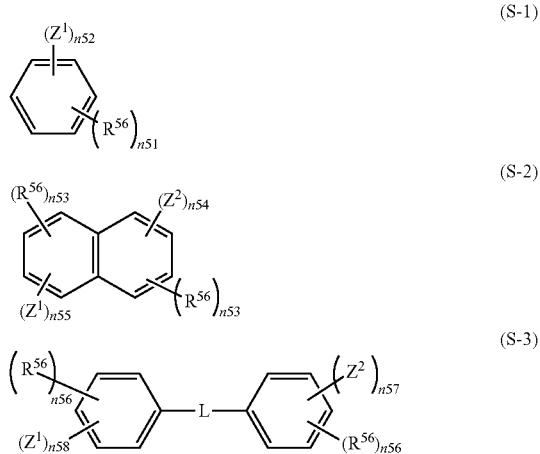

Specific examples of the arylsulfonic acid compound include p-toluenesulfonic acid, benzenesulfonic acid, 2-naphthalenesulfonic acid, naphthalene-1-sulfonic acid, 1,5-naphthalenedisulfonic acid, and 2,6-naphthalenedisulfonic acid.

The concentration of the sulfonic acid compound in the etchant is preferably 30% by mass or greater, more preferably 40% by mass or greater, and particularly preferably 50% by mass or greater. The upper limit thereof is preferably 90% by mass or less, more preferably 80% by mass or less, and particularly preferably 70% by mass or less. From the viewpoints of realizing excellent etching of a metal layer and effective protection of a germanium layer, it is preferable that the concentration of the sulfonic acid compound is set to be in the above-described range.

(Halogen Ion)

The etchant of the present invention includes halogen ions. Among halogen ions, a chlorine ion, a bromine ion, an iodine ion, and a fluorine ion are preferable and a chlorine ion and a bromine ion are more preferable. The supply sources of the halogen ions are not particularly limited, but the halogen ions may be supplied as salts with an organic cation described below or may be supplied by adding a hydride (hydrochloric acid, hydrobromic acid, or the like).

The concentration of the halogen ions in the etchant is preferably 0.01% by mass or greater, more preferably 0.02% by mass or greater, and particularly preferably 0.03% by mass or greater. The upper limit thereof is preferably 20% by mass or less, more preferably 15% by mass or less, still more preferably 10% by mass or less, even still more preferably 5% by mass or less, and particularly preferably 3% by mass or less. From the viewpoints that damage to the germanium-containing layer (first layer) or the germanium silicide layer (third layer) can be effectively suppressed while excellent etching properties of the metal layer (second layer) are maintained, it is preferable that the concentration of the halogen ions is set to be in the above-described range. In regard to identification of components of the etchant, it is not necessary for the components thereof to be confirmed as compounds. For example, in a case of hydrochloric acid, when chlorine ions (Cl$^-$) in an aqueous solution are identified, the presence and the amount thereof are grasped.

Moreover, in the present invention, the halogen ions may be used alone or in combination of two or more kinds thereof. In the case where the halogen ions are used in combination of two or more kinds thereof, the combining ratio is not particularly limited, but the total amount used thereof is preferably in the above-described concentration range as the sum of two or more kinds of ions.

(Nitric Acid or Nitric Acid Ion)

The etchant of the present embodiment includes nitric acid or nitric acid ions.

The concentration thereof in the etchant is preferably 0.1% by mass or greater, more preferably 1% by mass or greater, and particularly preferably 2% by mass or greater. The upper limit thereof is preferably 20% by mass or less, more preferably 10% by mass or less, still more preferably 5% by mass or less, and particularly preferably 3% by mass or less. The concentration thereof is preferably 10 parts by mass or greater, more preferably 30 parts by mass or greater, and particularly preferably 50 parts by mass or greater based on 100 parts by mass of the halogen ions. The upper limit thereof is preferably 3000 parts by mass or less, more preferably 1000 parts by mass or less, and particularly preferably 600 parts by mass or less.

From the viewpoints that damage to the germanium-containing layer (first layer) or the germanium silicide layer (third layer) can be effectively suppressed while excellent etching properties of the metal layer (second layer) are maintained, it is preferable that the concentration of the nitric acid or nitric acid ions is set to be in the above-described range. In regard to identification of components of the etchant, it is not necessary for the components thereof to be confirmed, for example, as nitric acid. When nitric acid ions (NO$_3^-$) in an aqueous solution are identified, the presence and the amount thereof are grasped. Moreover, the nitric acid or nitric acid ions may be used alone or in combination of two or more kinds thereof.

(Organic Cation)

It is preferable that the organic cation is a cation that has a carbon atom and exhibits alkalinity. Among examples, the organic cation is preferably an organic onium and more preferably organic ammonium. Specifically, organic ammonium having 5 or more carbon atoms is preferable and organic ammonium having 8 or more carbon atoms is more preferable. The upper limit of the number of the carbon atoms is practically 35 or less.

The action of the organic cation in a system is considered as described below although an assumption is included. In the etchant of the present invention, it is understood that halogen ions and nitric acid ions mainly show an etching action of the metal layer (second layer). It is understood that a sulfonic acid compound plays a role of decreasing the solubility of germanium and suppressing the elution thereof.

For this reason, it is preferable that a substantial amount of a sulfonic acid compound is used. In this manner, selectivity of the germanium-containing layer (first layer) and the metal layer (second layer) is increased, but it is not sufficient. In the present invention, when an organic cation is allowed to coexist in the layer, the organic cation is adsorbed on the surface of the germanium-containing layer and thus an effective anticorrosive surface is formed. In this manner, the selectivity of etching is markedly expressed along with the effect of suppressing elution of germanium done by the sulfonic acid compound. At this time, when the number of carbon atoms of the organic cation is increased (for example, 5 or more carbon atoms), the dissolution of germanium can be more markedly suppressed. From the viewpoint of such an action, a small amount of organic cation may be present in the system and, particularly preferably, the appropriate amount and the kind which may enhance a cooperative action with the sulfonic acid compound are selected.

Examples of the organic onium include a nitrogen-containing onium (quaternary ammonium or the like), a phosphorus-containing onium (quaternary phosphonium or the like), and a sulfur-containing onium (for example, $SRy_3^+$: Ry represents an alkyl group having 1 to 6 carbon atoms). Among these, a nitrogen-containing onium (quaternary ammonium, pyridinium, pyrazolium, imidazolium, or the like) is preferable. It is preferable that the organic cation is quaternary ammonium from among those described above.

As the organic onium, an ion represented by the following Formula (Q-1) is exemplified.

(Q-1)

In the formula, $R^{Q1}$ to $R^{Q4}$ each independently represent an alkyl group having 1 to 35 carbon atoms, an alkenyl group having 2 to 35 carbon atoms, an alkynyl group having 2 to 35 carbon atoms, an aryl group having 6 to 14 carbon atoms, an aralkyl group having 7 to 15 carbon atoms, or a group represented by the following Formula (y). In this case, the total number of carbon atoms of $R^{Q1}$ to $RQ^4$ is preferably 5 or more and more preferably 8 or more.

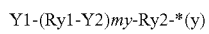

Y1 represents an alkyl group having 1 to 12 carbon atoms, an alkenyl group having 2 to 12 carbon atoms, an alkynyl group having 2 to 12 carbon atoms, an aralkyl group having 7 to 14 carbon atoms, an aryl group having 6 to 14 carbon atoms, a hydroxyl group, a sulfanyl group, an alkoxy group having 1 to 4 carbon atoms, or a thioalkoxy group having 1 to 4 carbon atoms. Y2 represents O, S, CO, or $NR^N$ ($R^N$ represents a hydrogen atom or an alkyl group having 1 to 6 carbon atoms). Ry1 and Ry2 each independently represent an alkylene group having 1 to 6 carbon atoms, an alkenylene group having 2 to 6 carbon atoms, an alkynylene group having 2 to 6 carbon atoms, an arylene group having 6 to 10 carbon atoms, or a combination of these. my represents an integer of 0 to 6. When my is 2 or greater, a plurality of Ry1's and Y2's may be different from each other. Ry1 and Ry2 may further include a substituent T. The symbol "*" indicates a binding site.

It is preferable that the organic cation is at least one selected from the group consisting of an alkyl ammonium cation, an aryl ammonium cation, and an alkyl-aryl ammonium cation.

Specifically, tetraalkyl ammonium (the number of carbon atoms is preferably in a range of 5 to 35, more preferably in a range of 8 to 25, and particularly preferably in a range of 10 to 25) is preferable. At this time, an alkyl group may be substituted with an optional substituent (for example, a hydroxyl group, an allyl group, or an aryl group) within the range not damaging the effects of the present invention. Further, the alkyl group may be linear, branched, or cyclic. Specific examples thereof include tetramethyl ammonium (TMA), tetraethyl ammonium (TEA), benzyl trimethyl ammonium, ethyl trimethyl ammonium, 2-hydroxy ethyl trimethyl ammonium, benzyl triethyl ammonium, hexadecyl trimethyl ammonium, tetrabutyl ammonium (TBA), tetrahexyl ammonium (THA), tetrapropyl ammonium (TPA), trimethyl benzyl ammonium, lauryl pyridinium, cetyl pyridinium, lauryl trimethyl ammonium, hexadecyl trimethyl ammonium, octadecyl trimethyl ammonium, didecyl dimethyl ammonium, dilauryl dimethyl ammonium, distearyl dimethyl ammonium, dioleyl dimethyl ammonium, lauryl dimethyl benzyl ammonium, and cetyl trimethyl ammonium.

A supply source of the organic cation is not particularly limited, and examples thereof include salts with the halogen ions or salts with hydroxy ions.

The concentration of the organic cation in the etchant is preferably $1\times10^{-6}$ mol/L or greater, more preferably $1\times10^{-5}$ mol/L or greater, and particularly preferably $5\times10^{-5}$ mol/L or greater. The upper limit thereof is preferably 1 mol/L or less, more preferably 0.5 mol/L or less, and particularly preferably 0.1 mol/L or less. From the viewpoints that damage to the germanium-containing layer (first layer) or the germanium silicide layer (third layer) can be effectively suppressed while excellent etching properties of the metal layer (second layer) are maintained, it is preferable that the concentration of the organic cation is set to be in the above-described range.

A C log P value of the organic cation is preferably −4 or greater and more preferably 0 or greater. From the viewpoints of effectively protecting the germanium-containing layer and realizing excellent etching selectivity, it is preferable that the C log P value of the organic cation is set to be in the above-described range.

An octanol/water partition coefficient (log P value) can be typically measured using a flask immersion method described in JIS Japanese Industrial Standards Z7260-107 (2000). Further, the octanol/water partition coefficient (log P value) can be estimated by a calculating chemical method or an empirical method instead of actual measurement. It is known that a Crippen's fragmentation method (J. Chem. Inf. Comput. Sci., 27, 21 (1987)), a Viswanadhan's fragmentation method (J. Chem. Inf. Comput. Sci., 29, 163 (1989)), Broto's fragmentation method (Eur. J. Med. Chem.-Chim. Theor., 19, 71 (1984)), or the like is used as the calculation method thereof. In the present invention, the Crippen's fragmentation method (J. Chem. Inf. Comput. Sci., 27, 21 (1987)) is used. The C log P value is obtained by calculating a common logarithm log P of a partition coefficient P to 1-octanol and water. An optional method or software can be used for calculating the C log P value, but ChemDraw Ultra 12.0 (trade name) is used in the present invention unless otherwise noted.

When a compound or a substituent and a linking group include an alkyl group and an alkylene group, an alkenyl group and an alkenylene group, or an alkynyl group and an alkynylene group, these may be cyclic, chain-like, linear, or branched and may be substituted or unsubstituted with an optional group. At this time, an alkyl group and an alkylene group, an alkenyl group and an alkenylene group, and an alkynyl group and an alkynylene group may interpose a group (such as O, S, CO, or $NR^N$) including a heteroatom therebetween or may form a ring structure along with the group including a heteroatom. Moreover, when an aryl group and a heterocyclic group are included, these may be a single ring or a condensed ring and may be substituted or unsubstituted.

In the present specification, respective technical matters such as selection of substituents or linking groups of compounds, the temperature, and the thickness can be combined with each other even when the lists thereof are respectively and independently described.

(Aqueous Medium)

In the embodiment, it is preferable that water (aqueous medium) is used as a medium of the etchant of the present invention. An aqueous medium containing dissolved components within the range not damaging the effects of the present invention may be used as water (aqueous medium) or water may contain a trace amount of inevitable mixing components. Among these, water subjected to a purification treatment such as distilled water, ion exchange water, or ultrapure water is preferable and ultrapure water used for manufacturing a semiconductor is particularly preferably used. The concentration of water is not particularly limited, but is preferably 1% by mass or greater, more preferably 10% by mass or greater, and particularly preferably 20% by mass or greater. The upper limit thereof is preferably 50% by mass or less, more preferably 45% by mass or less, and particularly preferably 40% by mass or less.

(pH)

In the present invention, the pH (25° C.) of the etchant is preferably 3 or less and more preferably 1 or less. From the viewpoints that damage to the first layer or the third layer can be effectively suppressed while the etching rate of the second layer is sufficiently secured, it is preferable that the pH of the etchant is set to be in the above-described range.

Further, according to the present invention, the pH is measured at room temperature (25° C.) using F-51 (trade name, manufactured by HORIBA, Ltd.).

(Kit)

The etchant in the present invention may be used for a kit obtained by dividing the raw material of the etchant into plural parts. For example, an aspect in which a liquid composition containing the above-described halogen ions and organic cation in water is prepared as a first liquid and a liquid composition containing nitric acid or nitric acid ions is prepared as a second liquid is exemplified. At this time, other components such as a sulfonic acid compound can be separately contained or can be contained together in a first liquid, a second liquid, or another third liquid.

As the usage example, an aspect of preparing an etchant by mixing both of the liquids and then using the etchant for the etching treatment at a suitable time is preferable. In this manner, deterioration of liquid performance due to decomposition of respective components is not caused and a desired etching action can be effectively exhibited. Here, the term "suitable time" after mixing both of the liquids indicates a period during which a desired action is lost after the mixing, and, specifically, the period is preferably within 60 minutes, more preferably within 30 minutes, still more preferably within 10 minutes, and particularly preferably within 1 minute. The lower limit thereof is not particularly limited, but is practically 1 second or longer.

The manner of mixing the first liquid and the second liquid is not particularly limited, but the mixing is preferably performed by circulating the first liquid and the second liquid in different channels and merging both of the liquids at a junction point. Subsequently, it is preferable that both of the liquids are circulated through the channels, an etchant obtained after both of the liquids are merged is ejected or sprayed from an ejection opening, and the etchant is brought into contact with a semiconductor substrate. In the embodiment, it is preferable that the process from which both of the liquids are merged and mixed with each other at the junction point to which the liquid is brought into contact with the semiconductor substrate is performed at the "suitable time" described above. When this process is described with reference to FIG. 3, the prepared etchant is sprayed from an ejection opening 13 and then applied to the upper surface of a semiconductor substrate S in a treatment container (treatment tank) 11. In the embodiment shown in the same figure, two liquids of A and B are supplied to be merged with each other at a junction point 14 and then the liquids are transitioned to the ejection opening 13 through a channel fc. A channel fd indicates a returning path for reusing a liquid chemical. It is preferable that the semiconductor substrate S is on a rotary table 12 and rotates along with the rotary table by a rotation driving unit M. In addition, in the embodiment in which such a substrate rotation type device is used, the same applies to a treatment using the etchant which is not used for a kit.

Moreover, in the etchant of the present invention, it is preferable that the amount of impurities in the liquid, for example, metals, is small when the usage of the etchant is considered. Particularly, the ion concentration of Na, K, and Ca in the liquid is preferably in a range of 1 ppt to 1 ppm (on a mass basis). Further, in the etchant, the number of coarse particles having an average particle diameter of 0.5 μm or greater is preferably 100 pieces/cm$^3$ or less and more preferably 50 pieces/cm$^3$ or less.

(Container)

The etchant of the present invention fills an arbitrary container to be stored, transported, and then used as long as corrosion resistance is not a problem (regardless of the container being a kit or not). Further, a container whose cleanliness is high and in which the amount of impurities to be eluted is small is preferable for the purpose of using the container for a semiconductor. As a usable container, "CLEAN BOTTLE" series (manufactured by ACELLO CORPORATION) or "PURE BOTTLE" (manufactured by KODAMA PLASTICS Co., Ltd.) is exemplified, but the examples are not limited thereto.

[Etching Conditions]

In an etching method of the present invention, it is preferable to use a sheet type device. Specifically, a sheet type device which has a treatment tack and in which the semiconductor substrate is transported or rotated in the treatment tank, the etchant is provided (ejection, spray, falling, dropwise addition, or the like) in the treatment tank, and the etchant is brought into contact with the semiconductor substrate is preferable.

Advantages of the sheet type device are as follows: (i) a fresh etchant is constantly supplied and thus reproducibility is excellent and (ii) in-plane uniformity is high. Further, a kit obtained by dividing the etchant into plural parts is easily used and, for example, a method of mixing the first and second liquids with each other in line and ejecting the liquid is suitably employed. At this time, a method of mixing the liquids with each other in line and ejecting the mixed solution after the temperature of both of the first liquid and the second liquid is adjusted or the temperature of one of the first liquid and the second liquid is adjusted is preferable. Between the two, adjusting the temperature of both liquids is more preferable. It is preferable that the managed temperature at the time of adjusting the temperature of the line is set to be in the same range as that of the treatment temperature described below.

The sheet type device is preferably provided with a nozzle in the treatment tank thereof and a method of ejecting the etchant to the semiconductor substrate by swinging the nozzle in the plane direction of the semiconductor substrate is preferable. In this manner, deterioration of the liquid can be prevented, which is preferable. Further, the liquid is separated into two or more liquids after the kit is prepared and thus gas or the like is unlikely to be generated, which is preferable.

The treatment temperature of performing etching is preferably 10° C. or higher and more preferably 20° C. or higher. The upper limit thereof is preferably 80° C. or lower, more preferably 70° C. or lower, still more preferably 60° C. or lower, even still more preferably 50° C. or lower, and particularly preferably 40° C. or lower. It is preferable that the temperature is set to be higher than or equal to the lower limit because the etching rate with respect to the second layer can be sufficiently secured. It is preferable that the temperature thereof is set to be lower than or equal to the upper limit thereof because temporal stability for the rate of the etching treatment can be maintained. In addition, when the etching treatment is carried out at around room temperature, this leads to a reduction of energy consumption.

In addition, the treatment temperature of etching is based on the temperature used for the substrate in a temperature measuring method shown in Examples below. However, the treatment temperature may be set by the temperature in the tank thereof in a case where the treatment temperature is managed by a storage temperature or a batch treatment and the treatment temperature may be set by the temperature in a circulation channel in a case where the treatment temperature is managed by a circulatory system.

The rate of supplying the etchant is not particularly limited, but is preferably in a range of 0.05 L/min to 5 L/min and more preferably in a range of 0.1 L/min to 3 L/min. It is preferable that the rate thereof is set to be greater than or equal to the lower limit because the in-plane uniformity of etching can be more excellently secured. It is preferable that the rate thereof is set to be less than or equal to the upper limit because the performance stabilized at the time of performing a treatment continuously can be secured. The rotation of the semiconductor substrate also depends on the size thereof and the semiconductor substrate rotates preferably at 50 rpm to 1000 rpm from the same viewpoint described above.

In sheet type etching according to the preferred embodiment of the present invention, it is preferable that the semiconductor substrate is transported or rotated in a predetermined direction and an etchant is brought into contact with the semiconductor substrate by spraying the etchant to the space of the semiconductor substrate. The rate of supplying the etchant and the rotation rate of the substrate are the same as those described above.

Figure 4:
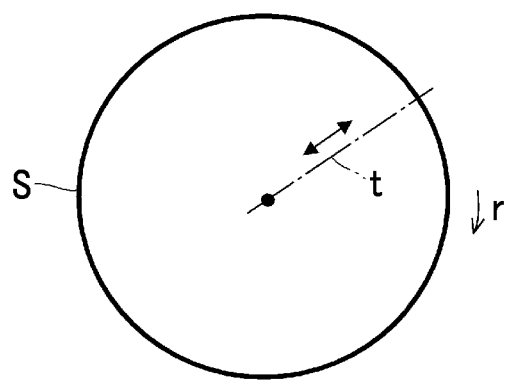
FIG. 4 is a plan view schematically illustrating a movement trajectory line of a nozzle with respect to a semiconductor substrate according to an embodiment of the present invention.

In the configuration of the sheet type device according to the preferred embodiment of the present invention, it is preferable that the etchant is provided while the ejection opening (nozzle) is moved as illustrated in FIG. 4. Specifically, in the present embodiment, the substrate is rotated in an r direction when the etchant is applied to the semiconductor substrate S. Further, the ejection opening is set to move along a movement locus line t extending to the end portion from the central portion of the semiconductor substrate. In this manner, the rotation direction of the substrate and the movement direction of the ejection opening are set to be different from each other in the present embodiment and thus both directions are set to be relatively moved. As a result, the etchant can be evenly provided for the entire surface of the semiconductor substrate and the uniformity of etching is suitably secured.

The moving speed of the ejection opening (nozzle) is not particularly limited, but is preferably 0.1 cm/s or greater and more preferably 1 cm/s or greater. The upper limit thereof is preferably 30 cm/s or less and more preferably 15 cm/s or less. The movement locus line may be linear or curved (for example, ark-shaped). In both cases, the movement speed can be calculated from the distance of an actual locus line and the time spent for the movement thereof. The time required for etching one sheet of substrate is preferably in a range of 10 seconds to 300 seconds.

It is preferable that the metal layer is etched at a high etching rate. An etching rate [R2] of the second layer (metal layer) is not particularly limited, but is preferably 20 Å/min or greater, more preferably 100 Å/min or greater, and particularly preferably 200 Å/min or greater in terms of productivity. The upper limit is not particularly limited, but is practically 1200 Å/min or less.

The exposure width of the metal layer is not particularly limited, but is preferably 2 nm or greater and more preferably 4 nm or greater from the viewpoint that the advantages of the present invention become remarkable. The upper limit thereof is practically 1000 nm or less, preferably 100 nm or less, and more preferably 20 nm or less from the viewpoint that the effects thereof become significant in the same manner.

An etching rate [R1] of the layer (first layer) containing germanium or the germanium silicide layer (third layer) is not particularly limited, but it is preferable that the layer is not excessively removed. The etching rate thereof is preferably 200 Å/min or less, more preferably 100 Å/min or less, still more preferably 50 Å/min, even still more preferably 20 Å/min or less, and particularly preferably 10 Å/min or less. The lower limit thereof is not particularly limited, but is practically 0.1 Å/min or greater in terms of the measurement limit.

In the selective etching of the first layer, the ratio of the etching rate ([R2]/[R1]) is not particularly limited, but is preferably 2 or greater, more preferably 10 or greater, still more preferably 20 or greater, and particularly preferably 50 or greater from the viewpoint of elements which need high selectivity. The upper limit thereof is not particularly limited and is preferred as the value becomes larger, but the upper limit thereof is practically 5000 or less. Further, the etching conditions of the germanium silicide layer (third layer) are the same as those of the germanium-containing layer (first layer) in a broad sense and are in common with a layer (for example, a layer of SiGe or Ge) before annealing is applied thereto. Accordingly, the germanium silicide layer can be substituted with the germanium-containing layer or the layer before annealing is applied thereto according to the etching rate thereof.

Further, since damages of a metal electrode layer such as Al, Cu, Ti, or W and an insulating film layer such as HfO, HfSiO, AlO$_x$, SiO, SiOC, SiON, TiN, SiN, or TiAlC (these are collectively referred to as a fourth layer in some cases) can be suitably suppressed, the etchant according to the preferred embodiment of the present invention is preferably used for a semiconductor substrate including these layers. Further, in the present specification, in a case where the composition of a metal compound is mentioned by the combination of the elements, this means that metal compounds with arbitrary compositions are broadly included. For example, SiOC (SiON) does not mean that the ratio of the amounts thereof is 1:1:1 but means that Si, O, and C (N) coexist. The same applies throughout the present specification and also to other metal compounds.

The time required for etching one substrate is preferably 10 seconds or longer and more preferably 50 seconds or longer. The upper limit thereof is preferably 300 seconds or shorter and more preferably 200 seconds or shorter.

[Manufacturer of Semiconductor Substrate Product]

In the present embodiment, it is preferable that a semiconductor substrate product having a desired structure is manufactured through a process of preparing a semiconductor substrate in which the silicon layer and the metal layer are formed on the silicon wafer, a process of annealing the semiconductor substrate, and a process of providing the etchant for the semiconductor substrate such that the etchant is brought into contact with the metal layer and selectively removing the metal layer. At this time, the specific etchant is used for etching. The order of the processes is not limited and other processes may be further included between respective processes.

The size of a wafer is not particularly limited, but a wafer whose diameter is 8 inches, 12 inches, or 14 inches is preferably used (1 inch=25.4 mm).

In addition, the term "preparation" in the present specification means that a specific material is included through synthesis or a mixture and a predetermined product is provided by purchase. Moreover, in the present specification, use of the etchant so as to perform etching respective materials of the semiconductor substrate is referred to as "application," but the embodiment thereof is not particularly limited. For example, the application broadly includes the etchant being brought into contact with the substrate. Specifically, the etching may be performed by immersing a batch type device or performed through ejection using a sheet type device.

In the present specification, the semiconductor substrate does not mean only a wafer but is used to mean a wafer having a circuit structure, including the entire substrate structure. The semiconductor substrate member indicates a member constituting the semiconductor substrate as defined above and may be formed of one material or plural materials. In addition, a processed semiconductor substrate needs to be distinguished from a semiconductor substrate product in some cases. If necessary, a processed semiconductor substrate is further distinguished therefrom, a chip obtained by applying another processing and dicing to be taken out and a processed product incorporating the chip are referred to as semiconductor elements. That is, a semiconductor element and a semiconductor product incorporating the semiconductor elements belong to a semiconductor substrate product in a broad sense.

EXAMPLES

Hereinafter, the present invention will be specifically described with reference to Examples, but the present invention is not limited to Examples described below. Further, "%" and "part" in the formulations or the blending amounts of Examples are on a mass basis unless otherwise noted.

Example 1 and Comparative Example 1

Preparation of Test Substrate

Ge was epitaxially grown to be formed to have a film thickness of 500 Å on a commercially available silicon substrate (diameter: 12 inches). In the same manner, a blanket wafer in which a Pt/Ni (10/90 [mass]) film was prepared by CVD or the like was prepared next to a Ge film.

(Etching Test)

The etching was performed under the following conditions in a sheet type device (POLOS (trade name), manufactured by SPS-Europe B. V.) with respect to the blank wafer and the substrate for a test and an evaluation test was carried out.

Treatment temperature: listed in Tables

Ejection amount: 1 L/min.

Wafer rotation speed: 500 rpm

Nozzle movement speed: 7 cm/S

Figure 3:
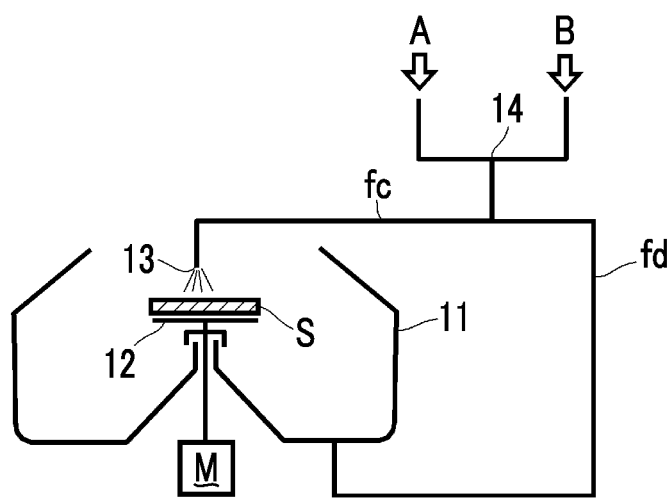
FIG. 3 is a configuration view of a device illustrating a part of a wet etching device according to a preferred embodiment of the present invention.

Further, the etchant was supplied by being separated into two liquids as described below to be line mixed (see FIG. 3). A supply line fc was heated such that the temperature thereof was adjusted. It does not take much time from the mixture of two liquids to provision of the mixed solution for the substrate and this means that the mixed solution is provided for the substrate immediately after the mixing.

First liquid (A): nitric acid and water

Second liquid (B): other components and, if necessary, water

The ratio of the first liquid to the second liquid was set such that the amounts thereof were substantially the same as each other in terms of the volume. According to the formulation, the amount was appropriately adjusted or only one liquid was supplied.

(Method of Measuring Treatment Temperature)

A radiation thermometer IT-550F (trade name, manufactured by HORIBA, Ltd.) was fixed to a position having a height of 30 cm on a wafer in the sheet type device. The thermometer was directed to the surface of the wafer outside from the center thereof by a distance of 2 cm and the temperature was measured while circulating a liquid chemical. The temperature was continuously recorded using a computer through digital output from the radiation thermometer. Among these, a value obtained by averaging the recorded values of the temperature for 10 seconds at the time when the temperature thereof was stabilized was set as a temperature on the wafer.

(Etching Rate)

The etching rate (ER) was calculated by measuring the film thickness before or after the etching treatment using Ellipsometry (VASE Spectroscopic ellipsometer was used, J.A. Woollam, Japan). The average value of five points was adopted (measurement conditions measurement range: 1.2 eV to 2.5 eV, measuring angles: 70 degrees and 75 degrees).

TABLE 1

| | Components of liquid chemical | | | | | | | | | | | | | | Evaluation results | | Selection |
|---|---|---|---|---|---|---|---|---|---|---|---|---|---|---|---|---|---|
| | Component 1 | | Component 2 | | Component 3 | | Nitric acid | | Sulfonic acid 1 | | Sulfonic acid 2 | | Concentration of cation mol/L | Water % by mass | Treatment conditions | NiPt ER (A/min.) | Ge ER (A/min.) | ratio of NiPt/Ge ER |
| No. | Compound | % by mass | Compound | % by mass | Compound | % by mass | Compound | % by mass | Compound | % by mass | Compound | % by mass | | | | | | |
| 101 | TMACl | 3.4 | — | — | — | — | HNO₃ | 6.5 | MSA | 51.0 | — | — | 3.1E-02 | Remainder | 30° C./5 min. | 280 | 21 | 13.3 |
| 102 | HCl | 0.5 | — | — | — | — | TMA—NO₃ | 15.5 | MSA | 52.1 | — | — | 1.1E-01 | Remainder | 30° C./5 min. | 240 | 20 | 12.0 |
| 103 | TEACl | 4.4 | — | — | — | — | HNO₃ | 7.2 | MSA | 40.7 | — | — | 3.9E-02 | Remainder | 30° C./5 min. | 321 | 8 | 40.1 |
| 104 | TBACl | 6.5 | — | — | — | — | HNO₃ | 9.2 | MSA | 56.1 | — | — | 2.3E-02 | Remainder | 30° C./5 min. | 281 | 0.9 | 312.2 |
| 105 | HBr | 0.1 | HCl | 0.5 | a-5 | 0.05 | HNO₃ | 7.1 | MSA | 60.0 | — | — | 1.4E-04 | Remainder | 30° C./5 min. | 305 | 0.5 | 610.0 |
| 106 | TMABr | 4.1 | HCl | 0.2 | — | — | HNO₃ | 6.0 | MSA | 58.0 | — | — | 2.7E-02 | Remainder | 30° C./5 min. | 330 | 17 | 19.4 |
| 107 | TEABr | 3.1 | HCl | 0.1 | — | — | HNO₃ | 8.2 | MSA | 61.6 | — | — | 1.5E-02 | Remainder | 30° C./5 min. | 290 | 6 | 48.3 |
| 108 | TPABr | 4.6 | HCl | 0.1 | — | — | HNO₃ | 6.4 | MSA | 51.2 | — | — | 1.7E-02 | Remainder | 30° C./5 min. | 345 | 1.1 | 313.6 |
| 109 | TBABr | 8.2 | HCl | 0.1 | — | — | HNO₃ | 5.4 | MSA | 40.5 | — | — | 2.5E-02 | Remainder | 30° C./5 min. | 350 | 0.8 | 437.5 |
| 110 | TBABr | 9.5 | — | — | — | — | HNO₃ | 6.4 | MSA | 58.2 | — | — | 2.9E-02 | Remainder | 30° C./5 min. | 192 | 0.5 | 384.0 |
| 111 | TPABr | 7.2 | — | — | — | — | HNO₃ | 5.4 | MSA | 55.1 | — | — | 2.7E-02 | Remainder | 30° C./5 min. | 221 | 0.4 | 552.5 |
| 112 | TPACl | 5.0 | — | — | — | — | HNO₃ | 8.4 | MSA | 63.5 | — | — | 2.3E-02 | Remainder | 30° C./5 min. | 264 | 1.2 | 220.0 |
| 113 | HCl | 0.7 | — | — | a-1 | 0.10 | HNO₃ | 8.7 | MSA | 59.4 | — | — | 3.5E-04 | Remainder | 30° C./5 min. | 298 | 0.6 | 496.7 |
| 114 | HCl | 0.6 | — | — | a-2 | 0.05 | HNO₃ | 7.8 | MSA | 50.1 | — | — | 1.5E-04 | Remainder | 30° C./5 min. | 302 | 0.7 | 431.4 |
| 115 | HCl | 0.8 | — | — | a-3 | 0.02 | HNO₃ | 7.4 | MSA | 62.5 | — | — | 7.6E-05 | Remainder | 30° C./5 min. | 341 | 0.9 | 378.9 |
| 116 | HCl | 0.5 | — | — | a-4 | 0.05 | HNO₃ | 8.6 | MSA | 50.8 | — | — | 1.6E-04 | Remainder | 30° C./5 min. | 284 | 0.5 | 568.0 |
| 117 | HCl | 0.8 | — | — | a-5 | 0.04 | HNO₃ | 7.5 | MSA | 52.4 | — | — | 1.1E-04 | Remainder | 30° C./5 min. | 246 | 1.2 | 205.0 |
| 118 | HCl | 1.0 | — | — | a-6 | 0.06 | HNO₃ | 7.9 | MSA | 58.4 | — | — | 1.7E-04 | Remainder | 30° C./5 min. | 256 | 0.9 | 284.4 |
| 119 | HCl | 0.9 | — | — | a-7 | 0.02 | HNO₃ | 8.4 | MSA | 51.5 | — | — | 4.8E-05 | Remainder | 30° C./5 min. | 286 | 1.5 | 190.7 |
| 120 | HCl | 0.9 | — | — | a-8 | 0.05 | HNO₃ | 8.8 | MSA | 60.1 | — | — | 8.8E-05 | Remainder | 30° C./5 min. | 264 | 1.1 | 240.0 |
| 121 | HCl | 0.7 | — | — | a-9 | 0.10 | HNO₃ | 9.2 | MSA | 48.5 | — | — | 1.7E-04 | Remainder | 30° C./5 min. | 291 | 1.4 | 207.9 |
| 122 | HCl | 0.6 | — | — | a-10 | 0.08 | HNO₃ | 8.9 | MSA | 62.4 | — | — | 2.4E-04 | Remainder | 30° C./5 min. | 302 | 1.3 | 232.3 |
| 123 | HCl | 0.8 | — | — | a-11 | 0.12 | HNO₃ | 8.5 | MSA | 61.4 | — | — | 2.6E-04 | Remainder | 30° C./5 min. | 287 | 0.8 | 358.8 |
| 124 | HCl | 0.5 | — | — | a-12 | 0.20 | HNO₃ | 7.8 | MSA | 58.7 | — | — | 6.3E-04 | Remainder | 30° C./5 min. | 291 | 0.9 | 323.3 |
| 125 | HBr | 0.6 | — | — | a-2 | 0.07 | HNO₃ | 8.4 | MSA | 58.7 | — | — | 2.1E-04 | Remainder | 30° C./5 min. | 302 | 1.4 | 215.7 |
| 126 | TMACl | 0.7 | — | — | a-8 | 0.30 | HNO₃ | 8.5 | MSA | 56.7 | — | — | 6.9E-03 | Remainder | 30° C./5 min. | 315 | 0.6 | 525.0 |
| 127 | HCl | 0.9 | — | — | a-3 | 0.05 | HNO₃ | 6.9 | PTSA | 50.4 | — | — | 1.9E-04 | Remainder | 30° C./5 min. | 320 | 1.2 | 266.7 |
| 128 | HCl | 1.2 | — | — | a-12 | 0.07 | HNO₃ | 7.4 | MSA | 60.0 | PTSA | 5.0 | 2.2E-04 | Remainder | 30° C./5 min. | 287 | 0.5 | 574.0 |
| 129 | TMBzCl | 5.2 | — | — | — | — | HNO₃ | 5.1 | MSA | 59.7 | — | — | 2.8E-02 | Remainder | 30° C./5 min. | 302 | 0.9 | 335.6 |
| 130 | TMBzBr | 4.1 | — | — | — | — | HNO₃ | 4.5 | MSA | 62.4 | — | — | 1.8E-02 | Remainder | 30° C./5 min. | 332 | 1.1 | 301.8 |
| 131 | HCl | 0.4 | — | — | a-10 | 0.05 | HNO₃ | 6.1 | MSA | 62.4 | — | — | 1.5E-04 | Remainder | 60° C./2 min. | 540 | 10.2 | 52.9 |
| 132 | HCl | 0.5 | HBr | 0.4 | a-6 | 0.05 | HNO₃ | 8.6 | MSA | 65.4 | — | — | 1.4E-04 | Remainder | 30° C./5 min. | 320 | 0.9 | 355.6 |
| 133 | HCl | 0.3 | — | — | a-10 | 0.04 | HNO₃ | 8.5 | MSA | 70.2 | — | — | 1.2E-04 | Remainder | 30° C./5 min. | 462 | 1.2 | 385.0 |
| 134 | HCl | 0.6 | TBABr | 0.5 | a-4 | 0.05 | HNO₃ | 8.7 | MSA | 58.3 | — | — | 1.7E-03 | Remainder | 30° C./5 min. | 311 | 1.5 | 207.3 |
| c01 | HCl | 0.2 | — | — | — | — | HNO₃ | 7.0 | MSA | 60.5 | — | — | | Remainder | 60° C./2 min. | 620 | 500 | 1.2 |
| c02 | HCl | 0.6 | — | — | — | — | HNO₃ | 6.0 | MSA | 55.0 | — | — | | Remainder | 30° C./5 min. | 320 | 300 | 1.1 |
| c03 | HCl | 0.005 | — | — | — | — | HNO₃ | 7.0 | MSA | 60.5 | — | — | | Remainder | 30° C./5 min. | 10 | 120 | 0.1 |
| c04 | HCl | 15.0 | — | — | — | — | HNO₃ | 7.5 | MSA | 55.0 | — | — | | Remainder | 30° C./5 min. | 100 | 1 | 100.0 |

TABLE 1-continued

| | Components of liquid chemical | | | | | | | | | | | | | | Evaluation results | | |
|---|---|---|---|---|---|---|---|---|---|---|---|---|---|---|---|---|---|
| | Component 1 | | Component 2 | | Component 3 | | Nitric acid | | Sulfonic acid 1 | | Sulfonic acid 2 | | Concentration of cation mol/L | Water % by mass | Treatment conditions | NiPt ER (A/min.) | Ge ER (A/min.) | Selection ratio of NiPt/Ge ER |
| No. | Compound | % by mass | Compound | % by mass | Compound | % by mass | Compound | % by mass | Compound | % by mass | Compound | % by mass | | | | | | |
| c05 | HCl | 0.6 | — | — | — | — | HNO$_3$ | 5.5 | MSA | 10.0 | — | — | | Remainder | 30° C./5 min. | 350 | 450 | 0.8 |
| c06 | HCl | 1.0 | — | — | — | — | HNO$_3$ | 40.0 | MSA | 25.0 | — | — | | Remainder | 30° C./5 min. | 450 | 400 | 1.1 |
| c07 | HCl | 0.6 | — | — | — | — | HNO$_3$ | 0.1 | MSA | 40.0 | — | — | | Remainder | 30° C./5 min. | 30 | 5 | 6.0 |

<Notes of Table>
HCl: hydrochloric acid
TMACl: tetramethyl ammonium chloride
TEACl: tetraethyl ammonium chloride
TPACl: tetrapropyl ammonium chloride
TBACl: tetrabutyl ammonium chloride
HBr: hydrobromic acid
TMABr: tetramethyl ammonium bromide
TEABr: tetraethyl ammonium bromide
TPABr: tetrapropyl ammonium bromide
TEABr: tetraethyl ammonium bromide
TBABr: tetrabutyl ammonium bromide
TMBzCl: trimethyl benzyl ammonium chloride
TMBzBr: trimethyl benzyl ammonium bromide
HNO$_3$: nitric acid
TMA—NO$_3$: tetramethyl ammonium nitrate
MSA: methanesulfonic acid
PTSA: p-toluenesulfonic acid
a-1: lauryl pyridinium chloride
a-2: cetyl pyridinium chloride
a-3: lauryl trimethyl ammonium chloride
a-4: hexadecyl trimethyl ammonium chloride
a-5: octadecyl trimethyl ammonium chloride
a-6: didecyl dimethyl ammonium chloride
a-7: dilauryl dimethyl ammonium chloride
a-8: distearyl dimethyl ammonium chloride
a-9: dioleyl dimethyl ammonium chloride
a-10: lauryl dimethyl benzyl ammonium chloride
a-11: cetyl trimethyl ammonium saccharin
a-12: cetyl trimethyl ammonium chloride From the results described above, it is understood that excellent selectivity of etching with respect to the metal layer, in which damage of the Ge-containing layer is suppressed, and can be obtained by adding a small amount of organic cation to the etchant containing a halogen ion, nitric acid, and a sulfonic acid compound. Further, when an organic cation having 5 or more carbon atoms or an organic cation having 8 or more carbon atoms is used, the selectivity is remarkably improved.

In addition, a Pt/Ni (10/90 [mass]) layer was formed on the Ge epitaxial layer. The formed layer was annealed at 800° C. for 10 seconds and a Ge silicide layer (NiPtGe) was formed to be used as a test substrate. The thickness of the annealed silicide layer was 15 nm and the thickness of the metal layer was 5 nm.

When the liquid chemicals Nos. 101 to 134 were used for the test substrate, it was confirmed that excellent etching properties of the metal layer and protection of the Ge silicide layer were realized.

The present invention has been described with reference to the embodiments, but the detailed description of the invention is not limited unless otherwise noted and the present invention should be broadly interpreted without departing from the spirit and the scope described in the aspects of the invention.

EXPLANATION OF REFERENCES

1: metal layer (second layer)
2: germanium-containing layer (first layer)
3: germanium silicide layer (third layer)
11: treatment container (treatment tank)
12: rotary table
13: ejection opening
14: junction point
S: substrate
21: silicon substrate
22: gate insulating film
23: gate electrode
25: side wall
26: source electrode
27: drain electrode
28: NiPt film

What is claimed is:

1. An etching method comprising: applying an etchant which contains a sulfonic acid compound, a halogen ion, nitric acid or a nitric acid ion, an organic cation, and water to a semiconductor substrate, wherein the organic cation is selected from the group consisting of lauryl pyridinium, cetyl pyridinium, lauryl trimethyl ammonium, hexadecyl trimethyl ammonium, octadecyl trimethyl ammonium, didecyl dimethyl ammonium, dilauryl dimethyl ammonium, distearyl dimethyl ammonium, dioleyl dimethyl ammonium, lauryl dimethyl benzyl ammonium and cetyl trimethyl ammonium.

2. The etching method according to claim 1, wherein the concentration of the organic cation is in a range of 0.000001 mol/L to 0.1 mol/L.

3. The etching method according to claim 1, wherein a semiconductor substrate has a first layer that includes germanium and a second layer that includes a metal species other than germanium.

4. The etching method according to claim 1, wherein the second layer is a layer including at least one metal species selected from nickel platinum, titanium, nickel, platinum, tungsten, and cobalt.

5. The etching method according to claim 3, wherein a ratio (R2/R1) of an etching rate R2 of the second layer to an etching rate R1 of the first layer is 10 or greater.

6. A method for manufacturing a semiconductor substrate product, wherein a semiconductor substrate product is manufactured through the etching method according to claim 1.

* * * * *